US007754351B2

(12) United States Patent
Eom et al.

(10) Patent No.: US 7,754,351 B2
(45) Date of Patent: Jul. 13, 2010

(54) EPITAXIAL (001) $BIFEO_3$ MEMBRANES WITH SUBSTANTIALLY REDUCED FATIGUE AND LEAKAGE

(75) Inventors: Chang-Beom Eom, Madison, WI (US); Ho Won Jang, Madison, WI (US)

(73) Assignee: Wisconsin Alumni Research Foundation (WARF), Madison, WI (US)

( * ) Notice: Subject to any disclaimer, the term of this patent is extended or adjusted under 35 U.S.C. 154(b) by 0 days.

(21) Appl. No.: 12/117,464

(22) Filed: May 8, 2008

(65) Prior Publication Data
US 2009/0280355 A1 Nov. 12, 2009

(51) Int. Cl.
*B32B 9/04* (2006.01)
*B32B 43/00* (2006.01)
(52) U.S. Cl. ............................ 428/701; 117/89; 117/84; 156/344
(58) Field of Classification Search ................ None
See application file for complete search history.

(56) References Cited

U.S. PATENT DOCUMENTS 6,809,604 B2 * 10/2004 Kawakubo et al. ...... 331/107 A
7,216,962 B2 * 5/2007 Miyazawa et al. .......... 347/68
2004/0224482 A1 * 11/2004 Kub et al. ............... 438/458
2006/0288928 A1 * 12/2006 Eom et al. ................ 117/89
2007/0029593 A1 * 2/2007 Ramesh ................. 257/295
2007/0138459 A1 * 6/2007 Wong et al. ............... 257/9

OTHER PUBLICATIONS

J. Kabelac et al. J. Vac. Sci. Techol. May/Jun. 2007, B 25 (3). p. 1049-1052.*
S. Singh et al. Integrated Ferroelectrics, 87, issue 1, 2007. p. 42-49.*
Nagarajan, V. et al., "Size effects in ultrathin epitaxial ferroelectric heterostructures," *Applied Physics Letters*, Vo. 84, No. 25, Jun. 2004, pp. 5225-5227; published by American Institute of Physics.
Jang, H. W. et al., "Epitaxial (001) $BiFeO_3$ membranes with substantially reduced fatigue and leakage," *Applied Physics Letters*, vol. 92, pp. 062910-1-062910-3 (2008); published by American Institute of Physics.

* cited by examiner

*Primary Examiner*—Jennifer C. McNeil
*Assistant Examiner*—Vera Katz
(74) *Attorney, Agent, or Firm*—Bell & Manning, LLC

(57) ABSTRACT

The present invention provides free-standing heterostructures including a layer of $BiFeO_3$ and a layer comprising a perovskite over which the $BiFeO_3$ is epitaxially grown. The layer comprising the perovskite has been released from a substrate upon which it was originally grown. Also provided are methods for forming the free-standing heterostructures, which may include transferring the free-standing heterostructures to other host substrates.

32 Claims, 5 Drawing Sheets

EPITAXIAL (001) BIFEO₃ MEMBRANES WITH SUBSTANTIALLY REDUCED FATIGUE AND LEAKAGE

STATEMENT OF GOVERNMENT RIGHTS

This invention was made with United States government support awarded by the following agencies: NAVY/ONR N00014-07-1-0215 and NSF 0210449. The United States government has certain rights in this invention.

FIELD OF THE INVENTION

The present invention relates to heterostructures comprising a layer of $BiFeO_3$ and a layer of perovskite over which the $BiFeO_3$ is epitaxially grown. Because the layer of perovskite has been released from the substrate upon which it was originally grown, the heterostructure is free-standing. The free-standing heterostructures are well-suited for use in ferroelectric memory and magnetoelectric devices.

BACKGROUND OF THE INVENTION

The lead-free perovskite $BiFeO_3$ has received considerable attention for non-volatile memory applications because of its large polarization of ~100 $\mu C/cm^2$ along the [111] direction. See Wang et al., Science 299, 1719 (2003); Li et al., Appl. Phys. Lett., 84, 5261 (2004); Das et al., Appl. Phys. Lett., 88, 242904 (2006); Legeugle et al., Appl. Phys. Lett., 91, 022907 (2007). Epitaxial growth of $BiFeO_3$ on silicon has been demonstrated using an intervening epitaxial $SrTiO_3$ buffer layer. See Wang et al., Appl. Phys. Lett., 85, 2574 (2004). However, these as-grown $BiFeO_3$ films exhibit relatively high coercive field ($E_c$), high leakage current, and reduced reliability, rendering the films less than desirable candidates for integrated microelectronic devices. See Ramesh et al., Nat. Mater., 6, 21 (2007). Furthermore, such films may be strained, a characteristic which may lead to degraded film properties and other unwanted effects.

In addition to its large ferroelectric polarization, $BiFeO_3$ is a multiferroic material with a high ferroelectric Curie temperature (~820° C.)[7] and a high antiferromagnetic Néel temperature (~370° C.). See G. Smolenskii, V. Isupov, A. Agranovskaya, and N. Kranik, Sov. Phys. Solid State 2, 2651 (1961) and Fischer et al., J. Phys. Solid State Phys., 13, 1931 (1980). Thus, $BiFeO_3$ offers the possibility of manipulating the magnetic state by an electric field at room temperature. See Ramesh et al., Nat. Mater., 6, 21 (2007). Recently, Zhao et al. showed evidence of coupling between the ferroelectric and magnetic order parameters in $BiFeO_3$. See Zhao et al., Nat. Mater., 5, 823 (2006). The magnetoelectric coupling in $BiFeO_3$ has also been suggested to enable the switching of a ferromagnetic material such as $(La,Sr)MnO_3$ or Co coupled to the multiferroic through exchange interactions. See Chu et al., Mater. Today, 10 (10), 16 (2007). However, a prerequisite to exploiting such electrical control of magnetism is the reliable switching of ferroelectric domains in $BiFeO_3$.

SUMMARY OF THE INVENTION

The present invention provides free-standing heterostructures comprising a layer of $BiFeO_3$ epitaxially grown over a layer comprising a perovskite. In such structures, the layer comprising the perovskite has been released from a sacrificial substrate on which it was epitaxially grown, thereby providing a free-standing heterostructure. The $BiFeO_3$ films in the free-standing heterostructures exhibit greatly improved ferroelectric properties as compared with as-grown $BiFeO_3$ films. In particular, the $BiFeO_3$ in the free-standing heterostructures can exhibit one or more of substantially reduced coercive field, substantially reduced leakage current, and fatigue-free switching behavior. As a result, the free-standing heterostructures are well-suited for use in ferroelectric memory and magnetoelectric devices.

The present invention is based, in part, on the inventors' discovery that certain ferroelectric properties, including high coercive field ($E_c$), high leakage current, and unreliable switching behavior, of as-grown $BiFeO_3$ films may be attributed to the constraint of the underlying substrate upon which the $BiFeO_3$ film is originally grown. The term "as-grown" refers to a $BiFeO_3$ film that is directly attached or indirectly attached (e.g., through other layers) to a substrate upon which it was originally grown. Such films may also be referred to as "clamped" films. The inventors have further discovered that the ferroelectric properties of these as-grown films may be greatly improved by releasing the $BiFeO_3$ films from the substrates upon which they were grown. $BiFeO_3$ films which have been released from the substrates upon which they were originally grown are referred to as free-standing films or free-standing membranes, released films or released membranes, or simply membranes. Similarly, heterostructures comprising $BiFeO_3$ films and other layers (e.g., a layer comprising a perovskite), wherein the other layers have been released from the substrates upon which the layers were originally grown are referred to as free-standing heterostructures.

The free-standing heterostructures provided herein comprise a layer of $BiFeO_3$ and a layer comprising a first perovskite over which the layer of $BiFeO_3$ is epitaxially grown. A variety of perovskites may be used. The $BiFeO_3$ in the free-standing heterostructure may be characterized by a number of properties, including, but not limited to its strain state, crystal structure, and ferroelectric properties. In some embodiments, the $BiFeO_3$ is substantially strain-free. Moreover, the $BiFeO_3$ in the free-standing heterostructures exhibit greatly improved ferroelectric properties as compared with as-grown $BiFeO_3$ films. For example, the $BiFeO_3$ in the free-standing heterostructures disclosed herein may exhibit increased remanent polarization, reduced coercive field, reduced leakage current, and/or reduced fatigue as compared with its as-grown $BiFeO_3$ counterparts.

Other layers may be included in the free-standing heterostructures including, but not limited to, a second layer of perovskite between the first perovskite and the $BiFeO_3$ and an electrode over the $BiFeO_3$. A variety of perovskites and materials for the electrode may be used. Furthermore, the free-standing heterostructures, which have been released from the substrates upon which they were originally grown, may be transferred onto a variety of host substrates.

The free-standing heterostructures may find use in a variety of applications and may be incorporated into a variety of devices, including, but not limited to, ferroelectric memory devices, magnetoelectric devices, displays, solar cells, smart cards, and rf tags. Accordingly, the present invention also provides devices comprising the free-standing heterostructures described herein.

Also disclosed are methods for forming the free-standing heterostructures. Such methods may include transferring the free-standing heterostructures to other substrates.

DETAILED DESCRIPTION

Figure 1:
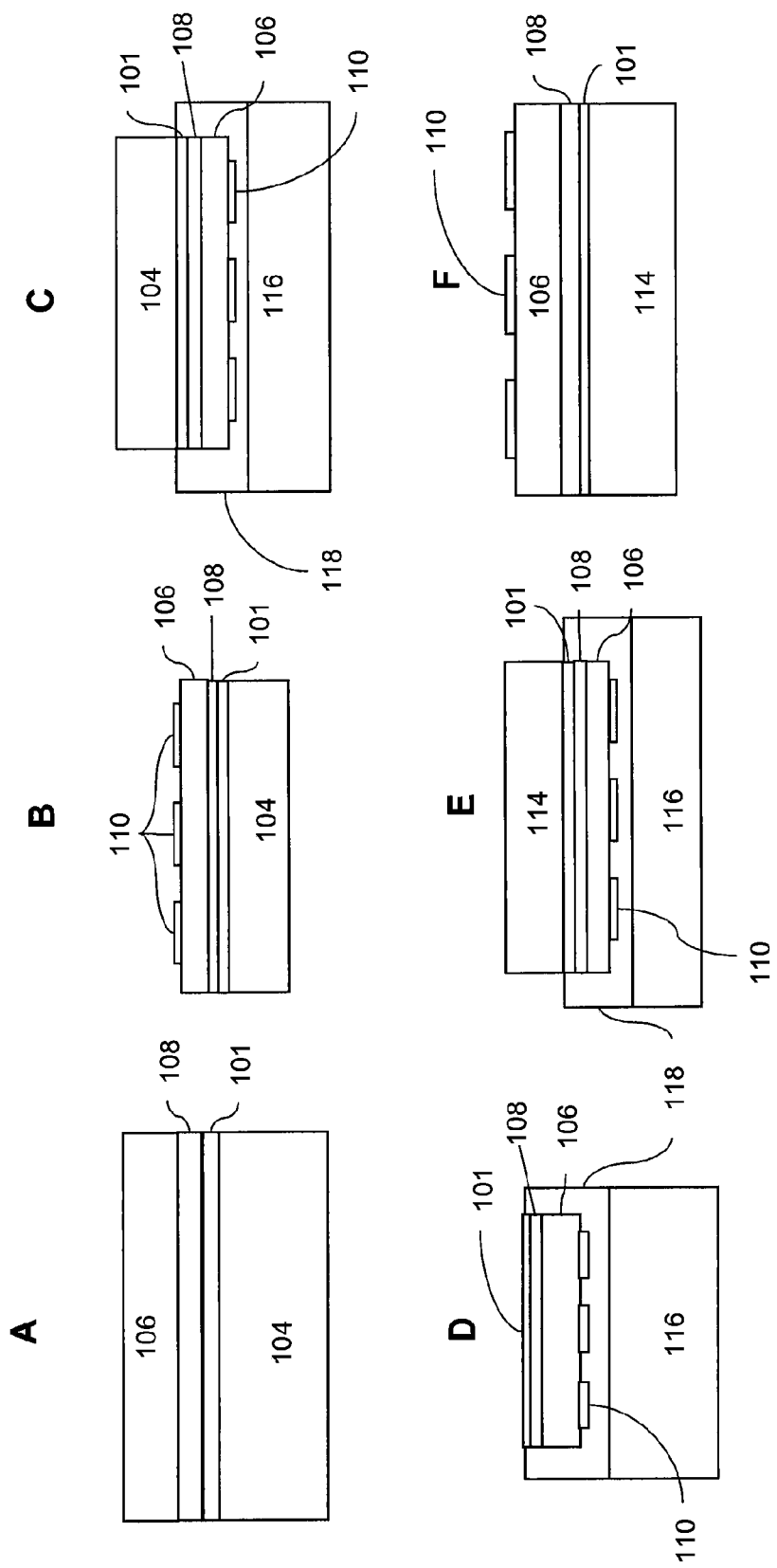
FIG. 1 illustrates a schematic diagram showing one possible fabrication process for forming strain-free $BiFeO_3$ free-standing membranes.

The present invention provides free-standing heterostructures comprising a layer of $BiFeO_3$ epitaxially grown over a layer comprising a perovskite. In such structures, the layer comprising the perovskite has been released from a sacrificial substrate on which it was epitaxially grown, thereby providing a free-standing heterostructure. Also disclosed are methods for forming the free-standing heterostructures.

Clamped $BiFeO_3$ films (i.e., $BiFeO_3$ films disposed over substrates upon which they were originally grown) are generally strained due to differences in crystal lattice parameters and thermal expansion characteristics of $BiFeO_3$ and the substrate material, or due to defects formed during growth of the film. In addition, such films may exhibit relatively high coercive field, high leakage current, and significant fatigue. However, release of as-grown $BiFeO_3$ films from their original substrates relieves strain and provides a released film with improved the ferroelectric properties. The strain relief may also accompany a symmetry change of the $BiFeO_3$ films from monoclinic or triclinic (as-grown, strained films) to rhombohedral for the $BiFeO_3$ released films.

The free-standing heterostructures comprise a layer of epitaxial $BiFeO_3$. The $BiFeO_3$ may be characterized by a number of properties. For example, the $BiFeO_3$ may be characterized by its strain state and crystal structure. In some embodiments, the $BiFeO_3$ is substantially strain-free. By substantially strain-free, it is meant that the average in-plane strain of the $BiFeO_3$ is approximately zero. In other embodiments, the out-of-plane and in-plane lattice parameters of the $BiFeO_3$ are approximately the same as that of bulk $BiFeO_3$, a further indication that the $BiFeO_3$ in the free-standing heterostructure is fully relaxed and strain-free. In such embodiments, the crystal symmetry of the $BiFeO_3$ may be rhombohedral.

The $BiFeO_3$ may be further characterized by its ferromagnetic properties, including remanent polarization ($P_r$), coercive field ($E_c$), fatigue, and electrical leakage. High remanent polarization, low coercive field, low fatigue, and low electrical leakage are desirable properties for certain ferroelectric materials, such as those used in ferroelectric memory and magnetoelectric devices. Lower cohesive field lowers the switching voltage of ferroelectric and magnetoelectric devices, which is desirable for electronic devices. Furthermore, the fatigue-free behavior with Pt top electrode is desirable for long term reliability of ferroelectric and magnetoelectric devices. In general, the $BiFeO_3$ in the free-standing heterostructures disclosed herein exhibit increased remanent polarization as compared to their as-grown $BiFeO_3$ counterparts. In some embodiments, the $BiFeO_3$ in the free-standing heterostructure exhibits a remanent polarization of at least 55 $μC/cm^2$. In other embodiments, the $BiFeO_3$ exhibits a remanent polarization of at least 58 $μC/cm^2$.

The $BiFeO_3$ in the free-standing heterostructures may further exhibit reduced coercive field, fatigue, and electrical leakage as compared to their as-grown $BiFeO_3$ counterparts. In some embodiments, the $BiFeO_3$ in the free-standing heterostructure exhibits a coercive field of 100 kV/cm or less. In other embodiments, the $BiFeO_3$ may exhibit a coercive field of 90 kV/cm or less, or even 80 kV/cm or less. In further embodiments, the $BiFeO_3$ remains fatigue free over at least $1 \times 10^9$ cycles as measured using a switching field equal to or greater than two times the remanent polarization of the $BiFeO_3$. In still other embodiments, the $BiFeO_3$ remains fatigue free over at least $1 \times 10^{10}$ cycles. In yet other embodiments, the $BiFeO_3$ exhibits a lower leakage current than its as-grown $BiFeO_3$ counterpart. In such embodiments, the $BiFeO_3$ in the free-standing heterostructure may exhibit a leakage current that is 2 times, 5 times, 10 times or even 100 times less than its as-grown $BiFeO_3$ counterpart.

The free-standing heterostructures disclosed herein further comprise a layer comprising a first perovskite over which the layer of $BiFeO_3$ is epitaxially grown. The perovskite functions as a buffer layer, allowing for improved epitaxial growth of $BiFeO_3$ over certain substrates, including silicon substrates. A variety of perovskites may be used, including but not limited to, $LaAlO_3$, $DyScO_3$, $GdScO_3$, $LaScO_3$, $CaTiO_3$, $BaTiO_3$, $PbTiO_3$, $CaZrO_3$, $SrZrO_3$, $SrTiO_3$, $SrRuO_3$, $BaZrO_3$, $SrHfO_3$, $PbZrO_3$, $KNbO_3$, and $KTaO_3$. The perovskite may be doped or undoped. In some embodiments, the first perovskite is $SrTiO_3$. In the structures disclosed herein, the layer comprising the first perovskite has been released from a sacrificial substrate on which it was epitaxially grown, thereby providing a free-standing heterostructure.

The free-standing heterostructures may further comprise other layers. In some embodiments, the layer comprising the first perovskite further comprises one or more sublayers. In some embodiments, the sublayer comprises a second perovskite between the first perovskite and the $BiFeO_3$. A variety of perovskites may be used, including, but not limited to those perovskites provided above. In some embodiments, the sublayer comprises $SrRuO_3$. In such embodiments, the $SrRuO_3$ may provide a bottom electrode in the free-standing heterostructure. In other embodiments, the free-standing heterostructures further comprise a top electrode disposed over the $BiFeO_3$. A variety of materials may be used to form the top electrodes. In some embodiments, the top electrode is a metal, including, but not limited to, Pt, $Sr_{1-x}Ca_xRuO_3$ ($0 \leq x \leq 1$), $Ba_{1-x}Sr_xRuO_3$ ($0 \leq x \leq 1$), $La_{1-x}Sr_xMnO_3$ ($0.2 \leq x \leq 0.5$), $LaNiO_3$, $IrO_x$, Ir, Ru and Ag.

As described above, the free-standing heterostructures disclosed herein have been released from a sacrificial substrate upon which the heterostructure was originally grown. These free-standing heterostructures may be transferred onto a variety of host substrates. Thus, in some embodiments, the free-standing heterostructure further comprises the host substrate disposed over the layer comprising the first perovskite. Any host substrate that is desirable for use in any of the devices discussed below may be used. In some embodiments, the host substrate comprises a metal (e.g., Au, Ni or Cu), a plastic (e.g., PEN, PET or polyimide), or a glass. In some embodiments, the host substrate comprises Au.

The thicknesses of the various layers and substrates described above may vary. In some embodiments, the layer of $BiFeO_3$ is from about 20 nm thick to about 5 µm thick. In some embodiments, the layer of $BiFeO_3$ is from about 200 nm thick to about 800 nm thick. In other embodiments, the layer of $BiFeO_3$ is from about 400 nm to about 600 nm thick. Similarly the thicknesses of the first perovskite layer, the second perovskite layer, the electrode, the sacrificial substrate and the host substrate may vary. The examples below include exemplary thicknesses for such layers and substrates, but it is to be understood the present invention encompasses other thickness for these layers.

The free-standing heterostructures disclosed herein may find use in a variety of applications. For example, the free-standing heterostructures may be used in ferroelectric memory devices, magnetoelectric devices, and related devices. Free-standing heterostructures transferred to a variety of flexible host substrates will find use in displays, solar cells, smart cards, and rf tags.

Also provided herein are methods for forming the free-standing heterostructures from as-grown heterostructures. In a basic embodiment, the method comprises releasing an as-grown heterostructure from a sacrificial substrate upon which it was grown. The as-grown heterostructure comprises a layer of $BiFeO_3$ and a layer comprising a first epitaxial perovskite over which the layer of $BiFeO_3$ is epitaxially grown. However, the as-grown heterostructure may further comprise other layers, as described below. The release of the as-grown heterostructure from the sacrificial substrate provides a free-standing heterostructure. In some embodiments, releasing the as-grown heterostructure comprises removing the sacrificial substrate from the layer comprising the first epitaxial perovskite.

The methods are compatible with a variety of sacrificial substrates. In some embodiments, the sacrificial substrate is miscut (001) silicon. The use of miscut (001) silicon may improve the quality of the $BiFeO_3$ films grown on such substrates. For example, $BiFeO_3$ grown over miscut (001) silicon substrates may include fewer domains, better stoichiometry, and less defective domain walls, and a more periodic domain structure than $BiFeO_3$ grown over non-miscut silicon substrates. Miscut substrates promote nucleation of only 71 degree ferroelastic domains (and suppress undesirable 109 degree ferroelastic domains) by breaking the symmetry of the substrates surfaces. The sacrificial substrate may be removed by a variety of techniques, including, but not limited to, dry etching and wet etching techniques. In some embodiments, the sacrificial substrate is removed by inductive plasma etching.

The method of forming a free-standing heterostructure from an as-grown heterostructure may further comprise forming the as-grown heterostructure prior to releasing the as-grown heterostructure from the sacrificial substrate. With reference to FIGS. 1A and 1B, in some embodiments the methods comprise forming a layer 101 comprising a first perovskite on a sacrificial substrate 104 and forming a layer of $BiFeO_3$ 106 over the first perovskite. The as-grown heterostructures may further comprise other layers. Thus, in some embodiments, a sublayer 108 comprising a second perovskite may be formed over the first perovskite prior to forming the layer of $BiFeO_3$. In other embodiments, the methods further comprise forming one or more electrodes 110 over the $BiFeO_3$.

The free-standing heterostructures may be transferred onto a variety of host substrates. Thus, in some embodiments, the methods further comprise disposing a host substrate over the layer comprising the first perovskite after releasing the as-grown heterostructure from the sacrificial substrate upon which it was originally grown. The transfer may be accomplished in a variety of ways. One way, shown in FIGS. 1C-1F, involves bonding the $BiFeO_3$ 106 to a supporting substrate 116 before releasing the layer 101 comprising the first perovskite from the sacrificial substrate 104. The supporting substrate serves to hold the as-grown heterostructure in place prior to releasing it from the sacrificial substrate to provide a free-standing heterostructure. In some embodiments, the $BiFeO_3$ is bonded to the supporting substrate via an adhesive 118. After the layer comprising the first perovskite is released from the sacrificial substrate, a host substrate 114 may be disposed over the layer. In further embodiments, the supporting substrate is removed. In those embodiments in which an adhesive was used to bond the $BiFeO_3$ to the supporting substrate, the supporting substrate may be removed by dissolving the adhesive.

The present invention, thus generally described, will be understood more readily by reference to the following examples, which are provided by way of illustration and are not intended to be limiting of the present invention.

EXAMPLES

The term "membrane" below refers to a free-standing membrane or a released membrane as described above.

Formation of epitaxial (001) $BiFeO_3$ as-grown films and released membranes. Epitaxial (001) $BiFeO_3$ films were grown by off-axis radio-frequency (rf) magnetron sputtering on (001) Si substrates miscut by 4° toward [110]. See Das et al., *Appl. Phys. Lett.* 88, 242904 (2006). Prior to the deposition of the $BiFeO_3$ films, an epitaxial 15-nm-thick $SrTiO_3$ buffer layer and 100-nm-thick $SrRuO_3$ bottom electrode were deposited on the 50 µm thick Si substrates by molecular-beam epitaxy and 90° off-axis rf magnetron sputtering, respectively. See Goncharova et al., *J. Appl. Phys.*, 100, 014912 (2006); Eom et al., *Science*, 258, 1766 (1992); and Eom et al., *Appl. Phys. Lett.*, 63, 2570 (1993). The fabrication process of epitaxial (001) $BiFeO_3$ membranes is described with schematic diagrams in FIG. 1. After epitaxial growth of $BiFeO_3$ films on the $SrRuO_3/SrTiO_3$/Si templates, Pt top electrodes (50 nm thick and 100 µm in diameter) were formed on the $BiFeO_3$ film by rf sputtering and photolithography. After measurement of the electrical properties of the capacitors with the Pt top electrodes, the underlying Si substrate was completely removed by dry etching. In the etch process, the bottom $SrTiO_3$ and $SrRuO_3$ layers were used as etch stop layers. In order to handle the $BiFeO_3$ membranes, 25-µm-thick Au platforms were formed on the thin-film membranes using electroplating. In this way capacitors of $BiFeO_3$ membranes with the same original Pt top electrodes were obtained and tested.

Figure 2:
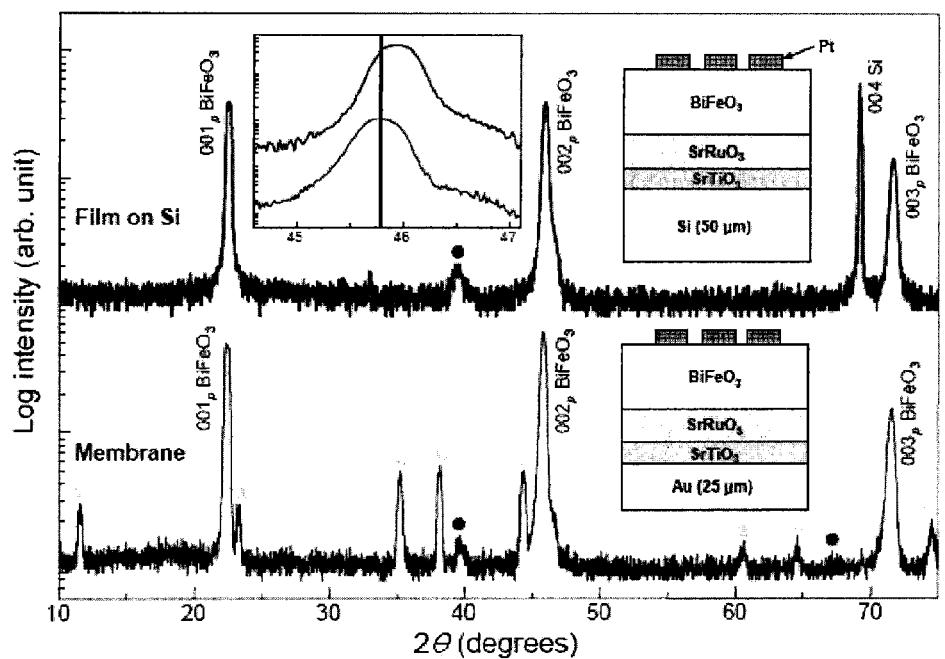
FIG. 2 shows high resolution x-ray diffraction (HRXRD) θ-2θ scans of 400 nm thick $BiFeO_3$ films before and after lift-off (release).

Strain and crystal structure of the epitaxial (001) $BiFeO_3$ as-grown films and released membranes. The epitaxial arrangement and crystalline quality of $BiFeO_3$ thin films and strain-free membranes were studied by high resolution four-circle x-ray diffraction HRXRD) and transmission electron microscopy (TEM). FIG. 2 shows x-ray diffraction θ-2θ scans of a 400-nm-thick as-grown $BiFeO_3$ film on (001) Si and a $BiFeO_3$ membrane after lift-off. The squares and circles correspond to diffraction peaks from Pt top electrodes and the Au plate, respectively. The inset shows an expanded view around the $002_p$ peaks and schematics of the as-grown film and $BiFeO_3$ membrane with Pt top electrodes. The vertical line in the inset indicates the 2θ value of bulk $002_p$ $BiFeO_3$. The diffraction pattern of the as-grown film revealed that it is single-phase and $(001)_p$ oriented. It was determined that the crystalline quality of $BiFeO_3$ film on (001) Si was as good as those grown on single crystal (001) $SrTiO_3$ substrates by the full width at half maximum (FWHM) of rocking curve of $002_p$ $BiFeO_3$ and cross-sectional TEM micrographs. See Das et al., *Appl. Phys. Lett.*, 88, 242904 (2006). For the $BiFeO_3$ membrane, the 004 Si peak disappears and diffraction peaks from the Au counter electrode deposited during the lift-off process were observed. See Jang et al., *Appl. Phys. Lett.* 92, 062910 (2008). The systematic variation of the 001 peaks toward lower diffraction angles after lift-off indicates an increase in the out-of-plane lattice parameter of the film. The out-of-plane lattice parameter of the as-grown film was found to be 3.943 Å, which is smaller than that of bulk $BiFeO_3$, 3.96 Å. This indicates that the as-grown film is subjected to a biaxial tensile strain in the plane of the film due to the large mismatch of thermal expansion coefficients between the Si substrate and $BiFeO_3$ film. As can be seen in the inset of FIG. 2, the out-of-plane lattice parameter of the membrane is the same as that of bulk $BiFeO_3$, suggesting that the as-grown film is subjected to an elastic strain which is fully relieved after lift-off.

HRXRD reciprocal space maps (RSMs) of the $BiFeO_3$ films were made before and after lift-off to determine the crystal symmetry and 3-dimensional strain state. The RSMs of the as-grown 400-nm-thick $BiFeO_3$ film around the $113_p$ reflection showed two peaks due to the existence of two domains. The RSMs for the $BiFeO_3$ membrane also showed peak splitting into two domains, supporting the idea that the overall domain structure was maintained after the lift-off process. The diagonal peak shape observed for the membrane indicated that the strain relief led to an increase of the mosaic spread of the film along the $(101)_p$ domain walls. Analysis of the RSMs of the as-grown film revealed that there was no change in the peak splitting along the $[00L]_p$ direction following an azimuthal rotation by 180°, whereas the membrane showed two different peak splitting with such an azimuthal rotation. In RSM, peak splitting along the $[00L]_p$ direction means that there are planes with different d-spacings. See Li et al., *Appl. Phys. Lett.* 84, 5261 (2004). Thus, the as-grown film was found to possess two different d-spacings for the $113_p$ reflection, but the membrane contains three different d-spacings. Taking this into consideration, the HRXRD RSM results confirmed that the crystal structure of the $BiFeO_3$ membrane was rhombohedral, while that of the as-grown film was monoclinic.

The unit cell dimensions of the 400-nm and 600-nm-thick as-grown $BiFeO_3$ films on (001) Si were determined to be: a=3.965 Å, b=3.990 Å, c=3.946 Å, β=89.52° and a=3.967, b=3.996, c=3.943, and β=89.51°, respectively. In contrast, the 400-nm and 600-nm-thick $BiFeO_3$ membranes were found to both have a rhombohedral unit cell with a=b=c=3.960 Å and α=89.4°, which is the same as that of bulk $BiFeO_3$ single crystals. All of the lattice parameters of the $BiFeO_3$ films on $SrTiO_3$ and Si substrates, and the $BiFeO_3$ membranes are summarized in Table 1.

| Sample | Lattice parameters (±0.005 Å) | Crystal symmetry | Average in-plane Strain (%) | $P_r$ ($\mu C/cm^2$) | $E_c$ (kV/cm) |
|---|---|---|---|---|---|
| 200 nm $BiFeO_3$ on $SrTiO_3$ | a = 3.925, b = 3.953, c = 4.007, β = 89.65° | $M_A$ | −0.54 | 66.5 ± 1 | 207 |
| 400 nm $BiFeO_3$ on $SrTiO_3$ | a = 3.936, b = 3.960, c = 3.991, β = 89.57° | $M_A$ | −0.30 | 64.1 ± 1 | 171 |
| 600 nm $BiFeO_3$ on $SrTiO_3$ | a = 3.942, b = 3.962, c = 3.981, β = 89.53° | $M_A$ | −0.20 | 61.8 ± 1 | 131 |
| 400 nm $BiFeO_3$ on Si | a = 3.965, b = 3.990, c = 3.946, β = 89.52° | $M_B$ | 0.55 | 51.9 ± 2 | 120 |
| 400 nm $BiFeO_3$ membrane | a = 3.960, b = 3.960, c = 3.960, α = 89.4° | R | 0 | 58.1 ± 1 | 79 |
| 600 nm $BiFeO_3$ on Si | a = 3.967, b = 3.996, c = 3.943, β = 89.51° | $M_B$ | 0.44 | 53.01 ± 2 | 107 |
| 600 nm $BiFeO_3$ membrane | a = 3.960, b = 3.960, c = 3.960, α = 89.4° | R | 0 | 58.3 ± 1 | 79 |

Figure 3:
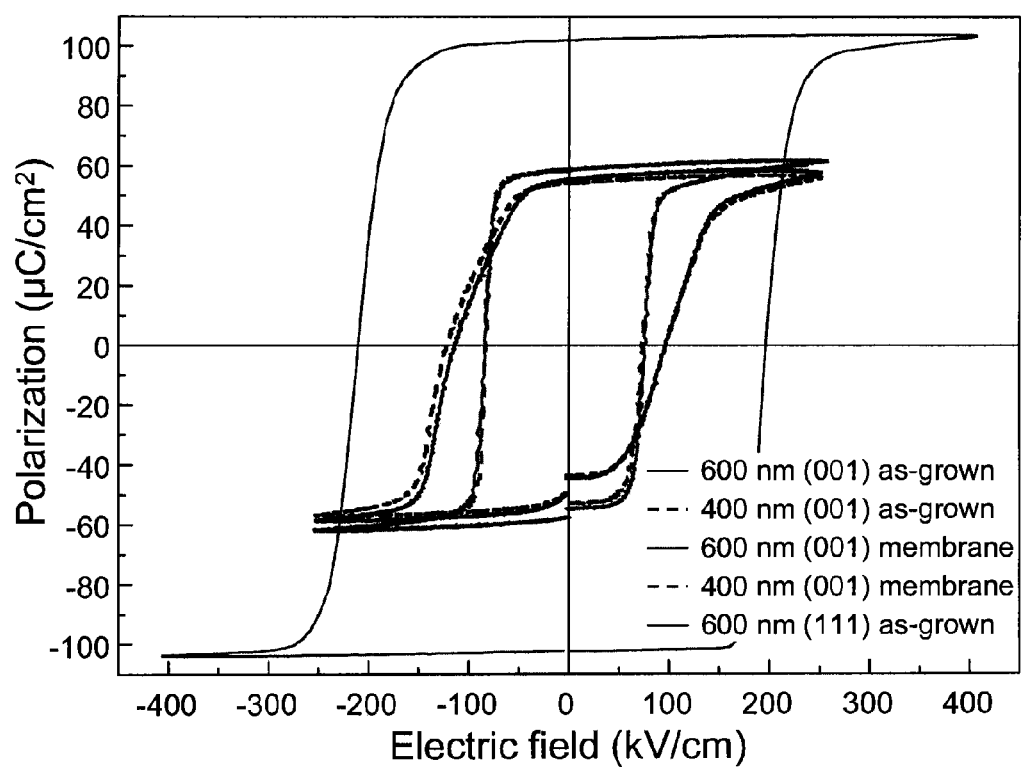
FIG. 3 shows polarization-electric field (P-E) hysteresis loops of the 400-nm and 600-nm-thick (001) $BiFeO_3$ as-grown films and free-standing membranes. Both loops were obtained from the same Pt top electrode before and after lift-off (release). The P-E hysteresis loop of a 600-nm-thick (111) $BiFeO_3$ film on (111) $SrTiO_3$ is shown for comparison.

Ferroelectric properties of the epitaxial (001) $BiFeO_3$ as-grown films and released membranes. The ferroelectric properties were characterized by polarization-electric field (P-E) hysteresis loop measurements. FIG. 3 shows the P-E hysteresis loops measured on 400-nm and 600 nm-thick (001) $BiFeO_3$ films on Si before and after lift-off. It should be noted that the same Pt top electrode was measured before and after lift-off, which excludes all other variables affecting P-E hysteresis loops. As shown in FIG. 3 and Table 1, the membranes display significantly enhanced ferroelectric properties, including increased remanent polarization ($P_r$) and reduced $E_c$. The 400-nm-thick as-grown film on Si has a higher coercive field than the 600-nm-thick one. However, both the 400-nm and 600-nm-thick membranes have almost the same coercive fields, which are 25-30% lower than the clamped films. Notably, the $E_c$ (80 kV/cm) of the membranes is the lowest ever reported for epitaxial $BiFeO_3$ films and comparable to those of epitaxial $BP(Arty)O_3$ films. See Wang et al., *Science* 299, 1719 (2003); Li et al., *Appl. Phys. Lett.* 84, 5261 (2004); Das et al., *Appl. Phys. Lett.* 88, 242904 (2006); and Eom et al., *Appl. Phys. Lett.* 63, 2570 (1993). This observation suggests that the relatively high $E_c$ reported for epitaxial $BiFeO_3$ thin films originates from a substrate-clamping effect. Also shown in FIG. 3 for comparison, (111)-oriented epitaxial $BiFeO_3$ films on (111) SrTiO$_3$ substrates show a large P$_r$ (102 µC/cm$^2$) and very high E$_c$ (200 kV/cm$^2$).

Figure 4:
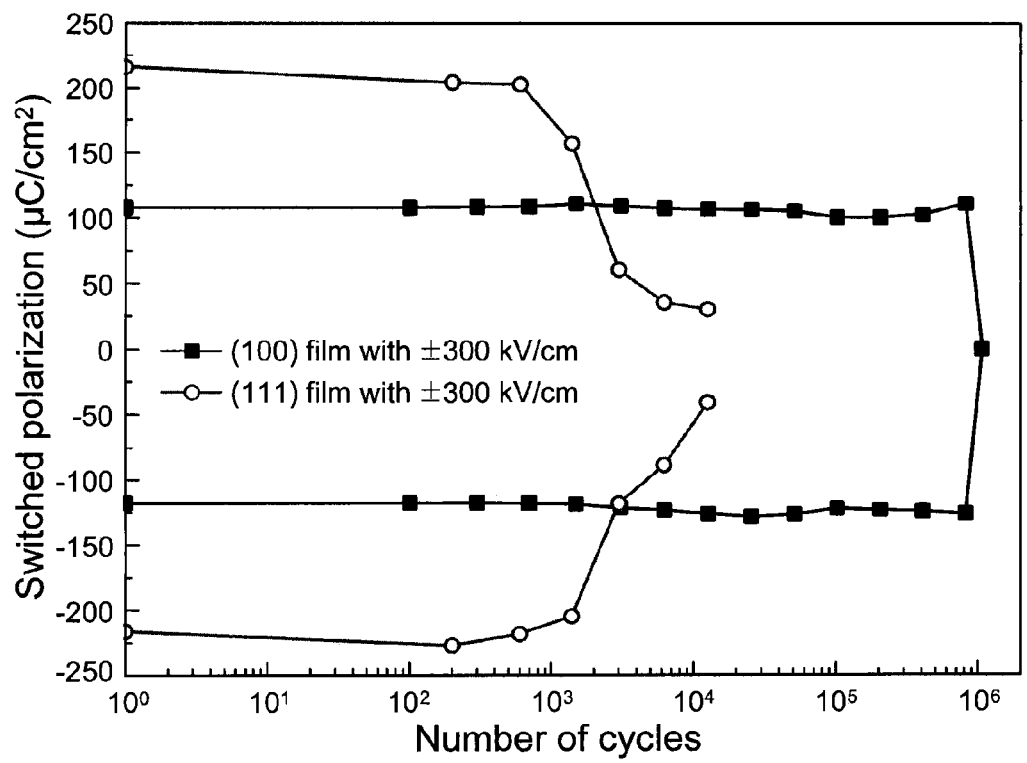
FIG. 4 shows the fatigue characteristics of 600-nm-thick (001) $BiFeO_3$/(001) Si and (111) $BiFeO_3$/(111) $SrTiO_3$ films. The width and frequency of switching pulses were 10 μs and 100 Hz, respectively.

Fatigue of (001) BiFeO$_3$ and (111) BiFeO$_3$ as-grown films. Fatigue is one of the most important factors in determining the reliability of ferroelectric and magnetoelectric devices. Fatigue tests were carried out on as-grown (001) and (111) BiFeO$_3$ films by applying 5 µs wide pulses with a repetition frequency of 100 Hz to the top Pt and bottom SrRuO$_3$ electrodes, as shown in FIG. 4. The cycling voltage was selected to be ±300 kV/cm, which gives complete switching for both films as shown in FIG. 3. The capacitor of the (001) BiFeO$_3$ film on Si showed no fatigue up to 9×10$^5$ cycles and an abrupt break down at 1×10$^6$ cycles. In contrast, the (111) BiFeO$_3$ film on (111) SrTiO$_3$ substrates exhibited a significant degradation in switching after 10$^4$ cycles, which is similar to the fatigue behavior typically seen in Pb(Zr,Ti)O$_3$. See Alshareef et al., *J. Mater. Res.* 9, 2968 (1994). The completely different fatigue behaviors between (001) and (111) films is consistent with the previous report on fatigue anisotropy. Bornand et al., showed that (001)-oriented thin films of the rhombohedral relaxor ferroelectric Pb(Yb$_{1/2}$Nb$_{1/2}$)O$_3$—PbTiO$_3$ have no fatigue (2P$_r$~50 µC/cm$^2$) up to 10$^{11}$ cycles, while (111) films exhibit a marked fatigue by voltage cycling. 71° domain switching occurs in the (001) BiFeO$_3$ film, as shown in FIG. 4, while only 180° domain switching occurs in the (111) BiFeO$_3$ film. This difference in domain switching leads to the fatigue anisotropy. See Bornand et al., *J. Appl. Phys.* 87, 3965 (2000); and Scott et al., *Appl. Phys. Lett.* 76, 3801 (2000).

Figure 5A:
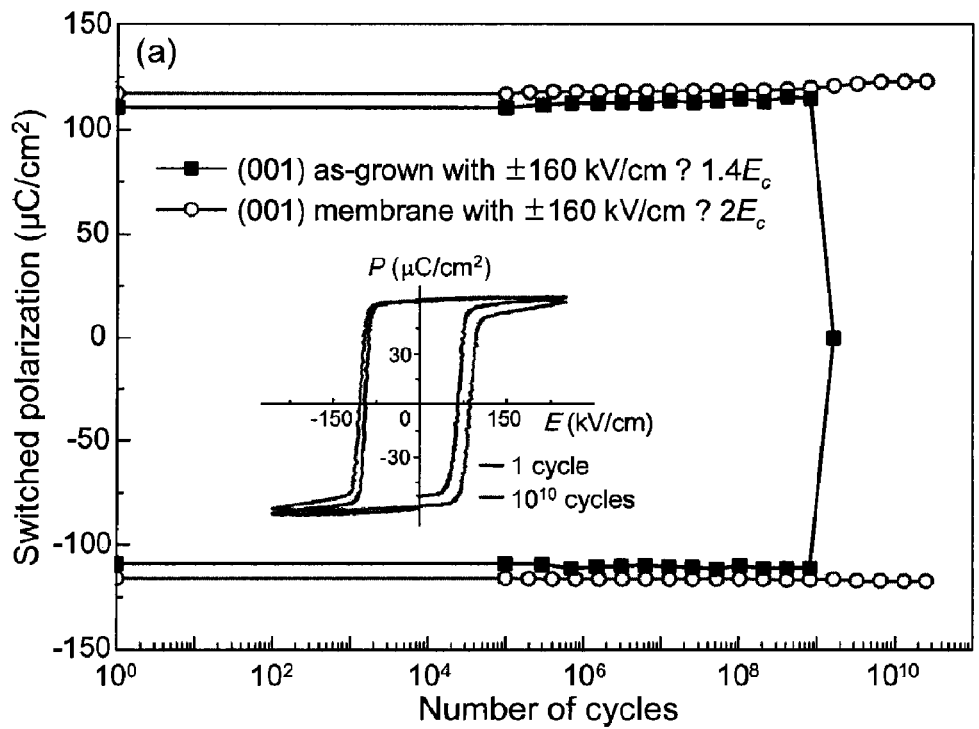
FIG. 5A shows the fatigue characteristics of a 400-nm-thick $BiFeO_3$ film and free-standing membrane. The width and frequency of the switching pulses were 5 μs and 100 kHz, respectively. The inset shows P-E hysteresis loops of the $BiFeO_3$ free-standing membrane before and after $10^{10}$ cycles with a switching field of ±160 kV/cm.

Fatigue of (001) BiFeO$_3$ as-grown films and released membranes. Also conducted were fatigue tests on the (001) BiFeO$_3$ as-grown films and membranes at a switching field of ±160 kV/cm. FIG. 5(a) shows the fatigue characteristics of a 400-nm-thick (001) as-grown film and membrane. The amplitudes of the switched polarization for the as-grown films and membranes were very close to the 2P$_r$ values shown in FIG. 3, indicating that the switching field of ±160 kV/cm provides complete switching in both cases. The capacitor of the as-grown film shows no fatigue up to 9×10$^8$ cycles, but breakdown at 1×10$^9$ cycles. In combination with the result in FIG. 3, it is concluded that the lower switching field suppresses the breakdown of the film during the voltage cycling. In contrast, the BiFeO$_3$ membrane with Pt top electrodes remains fatigue-free to 2.4×10$^{10}$ cycles. It is remarkable that 2P$_r$ of the BiFeO$_3$ membrane is as high as 116 µC/cm$^2$, significantly higher than that of Pb(Zr$_{0.45}$Ti$_{0.55}$)O$_3$, SrBi$_2$Ta$_2$O$_9$, and Bi$_{3.75}$La$_{0.25}$Ti$_3$O$_{12}$. See Alshareef et al., *J. Mater. Res.*, 9, 2968 (1994); C. P. de Araujo et al., *Nature*, 374, 627 (1995); and Park et al., *Nature* 401, 682 (1999). For the 600-nm-thick membranes, a very similar result was observed, confirming the fatigue-free behavior of the BiFeO$_3$ membranes.

Figure 5B:
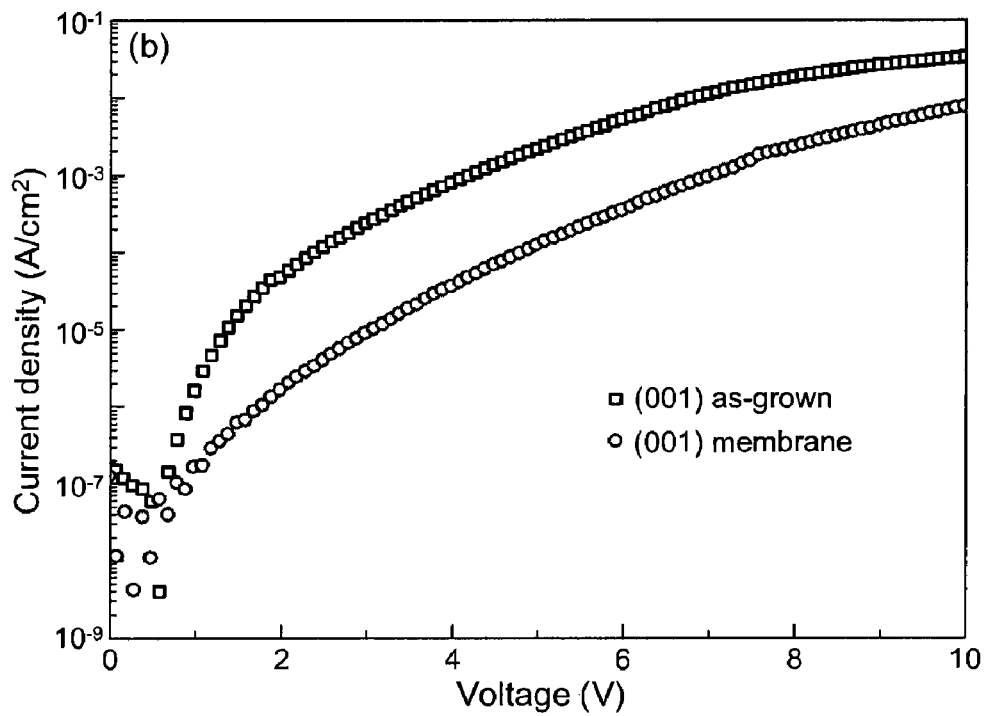
FIG. 5B shows the forward leakage current characteristics as a function of applied voltage of 400-nm-thick $BiFeO_3$ thin film capacitors before (film) and after liftoff (free-standing membrane).

Leakage current in (001) BiFeO$_3$ as-grown films and released membranes. It is widely accepted that oxygen vacancies formed during growth cause a portion of the Fe$^{3+}$ ions to become Fe$^{2+}$, which is responsible for the high leakage current in BiFeO$_3$. See Qi et al., *Appl. Phys. Lett.*, 86, 062903 (2005); and Pabst et al., *Appl. Phys. Lett.*, 90, 072902 (2007). While not wishing to be bound by theory, it is hypothesized that the breakdown during the fatigue test could be due to the formation of conducting filaments as they gather mobile defects such as oxygen vacancies. After breakdown, observation under an optical microscope revealed a small dark spot on the Pt top electrode, supporting the formation of conducting filaments. FIG. 5(b) shows that the membrane has a lower leakage current than the as-grown film. It is further hypothesized that the reduction in the leakage current and easy domain wall motion that arises from freeing the BiFeO$_3$ film from substrate clamping prevents breakdown during the fatigue test and leads to the observed fatigue-free behavior.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more."

What is claimed is:

1. A free-standing heterostructure comprising:
   (a) a layer of BiFeO$_3$, wherein the BiFeO$_3$ is substantially strain-free; and
   (b) a layer comprising a first perovskite over which the layer of BiFeO$_3$ is epitaxially grown, wherein the layer comprising the first perovskite has been released from a sacrificial substrate on which it was epitaxially grown to provide removal of the sacrificial substrate, and further wherein the BiFeO$_3$ exhibits a coercive field of 100 kV/cm or less.

2. The free-standing heterostructure of claim 1, wherein the first perovskite comprises SrTiO$_3$.

3. The free-standing heterostructure of claim 1, wherein the BiFeO$_3$ exhibits a remanent polarization of at least 55 µC/cm$^2$.

4. The free-standing heterostructure of claim 1, wherein the BiFeO$_3$ exhibits a remanent polarization of at least 58 µC/cm$^2$.

5. The free-standing heterostructure of claim 1, wherein the BiFeO$_3$ exhibits a coercive field of 90 kV/cm or less.

6. The free-standing heterostructure of claim 1, wherein the BiFeO$_3$ exhibits a coercive field of 80 kV/cm or less.

7. The free-standing heterostructure of claim 1, wherein the BiFeO$_3$ remains fatigue free over at least 1×10$^9$ cycles as measured using a switching field equal to or greater than two times the remanent polarization of the BiFeO$_3$.

8. The free-standing heterostructure of claim 7, wherein the BiFeO$_3$ remains fatigue free over at least 1×10$^{10}$ cycles.

9. The free-standing heterostructure of claim 1, wherein the BiFeO$_3$ is from about 20 nm thick to about 5 µm thick.

10. The free-standing heterostructure of claim 1, wherein the BiFeO$_3$ is from about 400 nm thick to about 600 nm thick.

11. The free-standing heterostructure of claim 1, wherein the layer comprising the first perovskite further comprises a sublayer comprising a second perovskite, the sublayer overlying the first perovskite and underlying the BiFeO$_3$.

12. The free-standing heterostructure of claim 11, wherein the second perovskite is selected from SrRuO$_3$, Sr$_{1-x}$Ca$_x$RuO$_3$ ($0 \leq x \leq 1$), Ba$_{1-x}$Sr$_x$RuO$_3$ ($0 \leq x \leq 1$), La$_{1-x}$Sr$_x$MnO$_3$ ($0.2 \leq x \leq 0.5$), LaNiO$_3$, IrO$_x$, or RuO$_x$.

13. The free-standing heterostructure of claim 1, further comprising an electrode disposed over the $BiFeO_3$.

14. The free-standing heterostructure of claim 1, further comprising a host substrate disposed on the layer comprising the first perovskite.

15. The free-standing heterostructure of claim 14, wherein the host substrate comprises a metal, a plastic, or a glass.

16. A method for forming a free-standing heterostructure from an as-grown, heterostructure, the method comprising releasing the as-grown heterostructure from a sacrificial substrate upon which it was grown to form the free-standing heterostructure, wherein the step of releasing provides removal of the sacrificial substrate, further wherein the as-grown heterostructure comprises a layer of $BiFeO_3$ and a layer comprising a first epitaxial perovskite over which the layer of $BiFeO_3$ is epitaxially grown, and further wherein, the $BiFeO_3$ in the free-standing heterostructure is substantially strain-free and exhibits a coercive field of 100 kV/cm or less.

17. The method of claim 16, wherein releasing the as-grown heterostructure comprises removing the sacrificial substrate from the layer comprising the first epitaxial perovskite.

18. The method of claim 16, wherein the sacrificial substrate is miscut (001) silicon.

19. The method of claim 16, wherein the first epitaxial perovskite comprises $SrTiO_3$.

20. The method of claim 16, wherein the layer comprising the first perovskite further comprises a sublayer comprising a second perovskite, the sublayer overlying the first perovskite and underlying the $BiFeO_3$.

21. The method of claim 20, wherein the second perovskite is selected from $SrRuO_3$, $Sr_{1-x}Ca_xRuO_3$ ($0 \leq x \leq 1$), $Ba_{1-x}Sr_xRuO_3$ ($0 \leq x \leq 1$), $La_{1-x}Sr_xMnO_3$ ($0.2 \leq x \leq 0.5$), $LaNiO_3$, $IrO_x$, or $RuO_x$.

22. The method of claim 16, wherein the as-gown heterostructure further comprises an electrode over the $BiFeO_3$.

23. The method of claim 16, further comprising disposing a host substrate over the layer of the first epitaxial perovskite after releasing the as-grown heterostructure.

24. The method of claim 23, wherein the host substrate comprises a metal, a plastic, or a glass.

25. The method of claim 16, further comprising bonding the $BiFeO_3$ to a supporting substrate before releasing the as-grown heterostructure.

26. The method of claim 25, wherein the $BiFeO_3$ is bonded to the supporting substrate using an adhesive.

27. The method of claim 25, further comprising disposing a host substrate over the layer comprising the first epitaxial perovskite after releasing the as-grown heterostructure.

28. The method of claim 27, further comprising removing the supporting substrate.

29. The method of claim 16, wherein the first epitaxial perovskite is in contact with the sacrificial substrate and wherein releasing the as-grown heterostructure comprises releasing the as-grown heterostructure at the interface between the first epitaxial perovskite and the sacrificial substrate by removing the sacrificial substrate from the first epitaxial perovskite.

30. The method of claim 29, wherein the sacrificial substrate is miscut (001) silicon.

31. A free-standing heterostructure comprising:
(a) a layer of $BiFeO_3$, wherein the $BiFeO_3$ is substantially strain-free; and
(b) a layer comprising a first perovskite over which the layer of $BiFeO_3$ is epitaxially grown, wherein the layer comprising the first perovskite has been released from a sacrificial substrate on which it was epitaxially grown to provide removal of the sacrificial substrate, and further wherein the $BiFeO_3$ has rhombohedral crystal symmetry.

32. The free-standing heterostructure of claim 31, wherein the $BiFeO_3$ exhibits a coercive field of 100 kV/cm or less.

* * * * *